United States Patent [19]
Kim

[11] Patent Number: 5,917,302
[45] Date of Patent: Jun. 29, 1999

[54] HARMONIC CURRENT ATTENUATING DEVICE OF A MOTOR

[75] Inventor: Bu-Hyeon Kim, Kwangju, Rep. of Korea

[73] Assignee: Kwangju Electronics Co., Ltd., Kwangju, Rep. of Korea

[21] Appl. No.: 08/994,267

[22] Filed: Dec. 19, 1997

[30] Foreign Application Priority Data

| Aug. 25, 1997 | [KR] | Rep. of Korea | 97-40767 |
| Aug. 25, 1997 | [KR] | Rep. of Korea | 97-40769 |
| Aug. 25, 1997 | [KR] | Rep. of Korea | 97-40770 |
| Aug. 25, 1997 | [KR] | Rep. of Korea | 97-40771 |
| Aug. 25, 1997 | [KR] | Rep. of Korea | 97-40772 |
| Aug. 25, 1997 | [KR] | Rep. of Korea | 97-40773 |
| Aug. 25, 1997 | [KR] | Rep. of Korea | 97-40777 |
| Aug. 25, 1997 | [KR] | Rep. of Korea | 97-40778 |
| Aug. 25, 1997 | [KR] | Rep. of Korea | 97-40779 |

[51] Int. Cl.$^6$ .................................................. H01F 27/26
[52] U.S. Cl. ........................... 318/629; 318/245; 336/234
[58] Field of Search ..................................... 318/629, 244, 318/245, 246; 336/222, 225, 233, 234

[56] References Cited

U.S. PATENT DOCUMENTS

| 2,064,773 | 12/1936 | Vogt . |
| 2,350,029 | 5/1944 | Glass, Jr. . |
| 3,660,787 | 5/1972 | Mahmoud et al. . |
| 3,683,271 | 8/1972 | Kobayashi . |
| 4,288,729 | 9/1981 | Anzai et al. ........................ 318/505 X |
| 4,491,819 | 1/1985 | Ray . |
| 4,573,004 | 2/1986 | Herve . |

OTHER PUBLICATIONS

"The Radio Amateur's Handbook", 51$^{th}$ Edition, Editor Myers, et al, Publisher: The American Radio Relay League, 1974. pp. 26 and 39.

*Primary Examiner*—Bentsu Ro
*Attorney, Agent, or Firm*—Knobbe, Martens, Olson & Bear, LLP

[57] ABSTRACT

A harmonic current attenuating device of a motor for attenuating a harmonic current generated from the motor by controlling the rotation speed by varying a sine wave voltage into a non-sinusoidal wave by phase-controlling the sine wave voltage, comprises a reactor having an E shape core, a coil wound to the E shape core and an I shape core.

10 Claims, 9 Drawing Sheets

| Harmonic NO. | IEC Standard | Test data | Remarks |
|---|---|---|---|
| 2 | 1.080A | 0.009759A | PASS |
| 3 | 2.300A | 2.691000A | FAIL |
| 4 | 0.430A | 0.007791A | PASS |
| 5 | 1.140A | 1.045200A | PASS |
| 6 | 0.300A | 0.004830A | PASS |
| 7 | 0.770A | 0.405800A | PASS |
| 8 | 0.230A | 0.002712A | PASS |
| 9 | 0.400A | 0.217500A | PASS |
| 10 | 0.184A | 0.002248A | PASS |
| 11 | 0.330A | 0.089450A | PASS |
| 12 | 0.153A | 0.001731A | PASS |
| 13 | 0.210A | 0.039800A | PASS |
| 14 | 0.131A | 0.000740A | PASS |
| 15 | 0.150A | 0.024530A | PASS |
| 16 | 0.115A | 0.000911A | PASS |
| 17 | 0.132A | 0.024690A | PASS |
| 18 | 0.102A | 0.001344A | PASS |
| 19 | 0.118A | 0.026880A | PASS |
| 20 | 0.092A | 0.001211A | PASS |

| Harmonic NO. | IEC Standard | Test data | Remarks |
|---|---|---|---|
| 2 | 1.080A | 0.009132A | PASS |
| 3 | 2.300A | 2.194000A | PASS |
| 4 | 0.430A | 0.005564A | PASS |
| 5 | 1.140A | 0.506100A | PASS |
| 6 | 0.300A | 0.001942A | PASS |
| 7 | 0.770A | 0.136480A | PASS |
| 8 | 0.230A | 0.003074A | PASS |
| 9 | 0.400A | 0.015213A | PASS |
| 10 | 0.184A | 0.003608A | PASS |
| 11 | 0.330A | 0.057780A | PASS |
| 12 | 0.153A | 0.000900A | PASS |
| 13 | 0.210A | 0.024390A | PASS |
| 14 | 0.131A | 0.000603A | PASS |
| 15 | 0.150A | 0.039450A | PASS |
| 16 | 0.115A | 0.001955A | PASS |
| 17 | 0.132A | 0.039410A | PASS |
| 18 | 0.102A | 0.000500A | PASS |
| 19 | 0.118A | 0.024300A | PASS |
| 20 | 0.092A | 0.001203A | PASS |

| Harmonic NO. | IEC Standard | Test data | Remarks |
|---|---|---|---|
| 2 | 1.080A | 0.002232A | PASS |
| 3 | 2.300A | 1.369000A | PASS |
| 4 | 0.430A | 0.000585A | PASS |
| 5 | 1.140A | 0.112010A | PASS |
| 6 | 0.300A | 0.000317A | PASS |
| 7 | 0.770A | 0.057530A | PASS |
| 8 | 0.230A | 0.000786A | PASS |
| 9 | 0.400A | 0.009069A | PASS |
| 10 | 0.184A | 0.001481A | PASS |
| 11 | 0.330A | 0.007287A | PASS |
| 12 | 0.153A | 0.001251A | PASS |
| 13 | 0.210A | 0.012287A | PASS |
| 14 | 0.131A | 0.000402A | PASS |
| 15 | 0.150A | 0.019555A | PASS |
| 16 | 0.115A | 0.000927A | PASS |
| 17 | 0.132A | 0.014067A | PASS |
| 18 | 0.102A | 0.002175A | PASS |
| 19 | 0.118A | 0.007243A | PASS |
| 20 | 0.092A | 0.001855A | PASS | ns
HARMONIC CURRENT ATTENUATING DEVICE OF A MOTOR

BACKGROUND OF THE INVENTION

1. Field of the Invention

The present invention relates to a harmonic current attenuating device of a motor, and more particularly to a harmonic current attenuating device of a motor which can attenuate the harmonic current generated while driving a motor of a cleaner.

2. Discussion of Related Art

Figure 1:
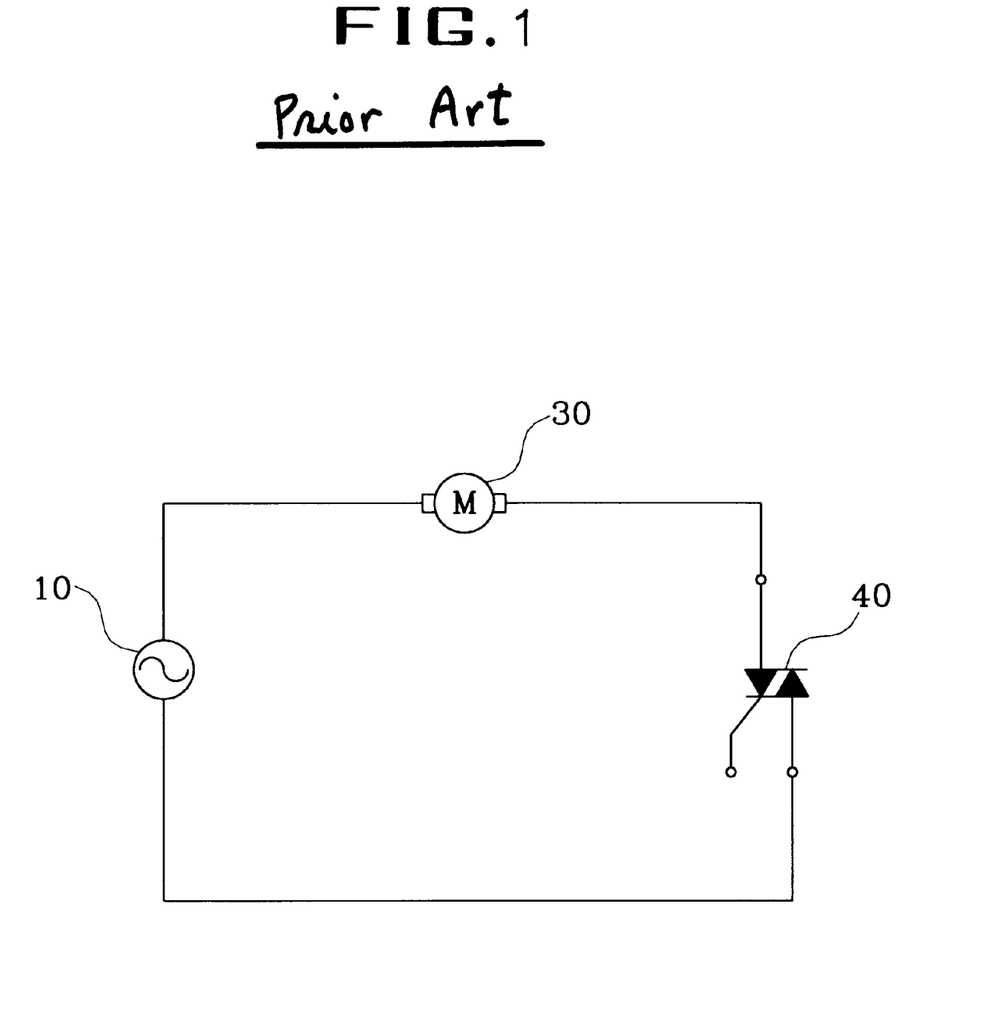
FIG. 1 is a diagram showing a motor driving circuit in a general cleaner according to a prior art.

A typical motor driving circuit in a cleaner is shown in FIG. 1. As can be seen from FIG. 1, a motor 30 is driven by an alternating current power with a commercial frequency supplied from a power supplying unit 10, the internal air is compulsorily circulated by an impeller which is rotated by the engagement with the motor, and then contaminants like dusts are sucked in from a suction opening by the wind generated by the pressure difference between an exterior and an interior of the cleaner.

Figure 2:
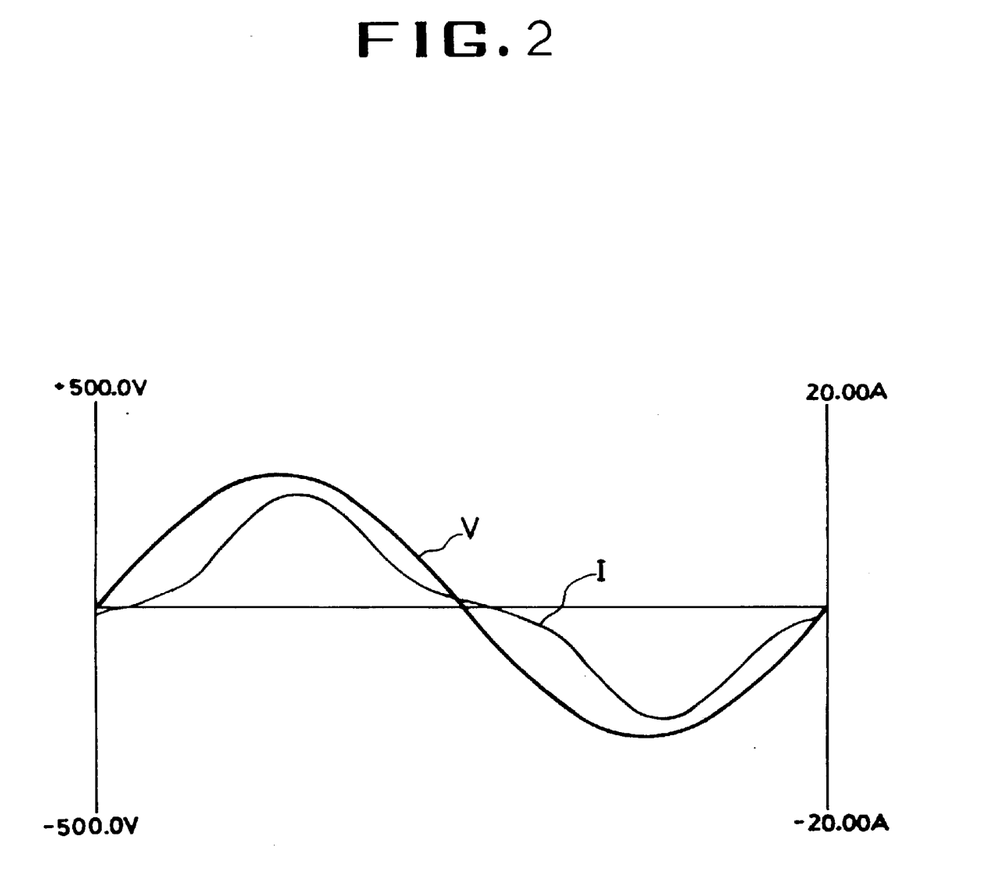
FIGS. 2 and 3 are diagrams explaining the harmonic current generated while driving a general motor of the prior art.
Figure 3:
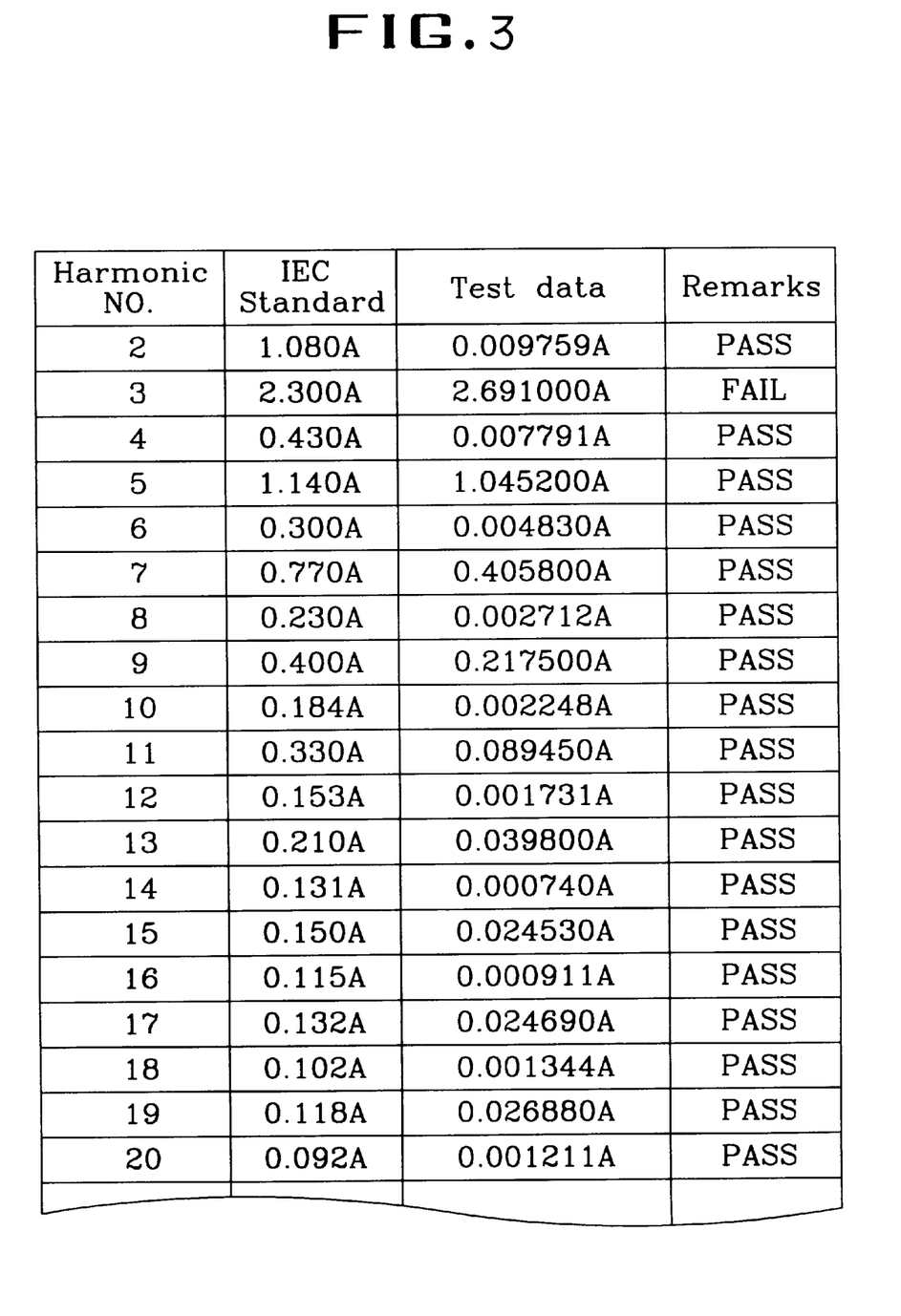

FIG. 2 shows waveforms of the voltage V and current I supplied to the motor 30.

In the meanwhile, the harmonic current is generated because the sine wave voltage supplied from the power supplying unit 10 is phase-controlled and changed to a non-sinusoidal wave voltage by a TRIAC (Triode AC switch) 40 which is switching-controlled by a gate signal, and then is supplied to the motor 30.

With the spread of these goods, the total amount of the harmonic current drawn to a power system is increased, causing an operating disorder of a power condenser and of a brake and the breakdown of a transformer.

In order to prevent the disorder due to the harmonic current as described above, an IEC (International Electrotechnical Commission) established a standard of limiting the harmonic current. According to this standard, among various harmonic currents generated at the cleaner when controlling at the phase of 90°, the one that matters is a 3rd harmonic current.

Thus, researches have been made on the technique for attenuating the 3rd harmonic current in various technical fields related to the cleaner.

SUMMARY OF THE INVENTION

Accordingly, the present invention is directed to a harmonic current attenuating device of a motor that substantially obviates one or more of the problems due to limitations and disadvantages of the related art.

An object of the present invention is to provide a harmonic current attenuating device of a motor which can effectively attenuate the harmonic current generated from a motor.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a harmonic current attenuating device of a motor for attenuating a harmonic current generated from the motor by controlling the rotation speed by changing a sine wave voltage into a non-sinusoidal wave by phase-controlling the sine wave voltage, comprises a reactor having an E shape core, a coil wound to the E shape core and an I shape core.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF PREFERRED EMBODIMENT

Reference will now be made in detail to the preferred embodiments of the present invention, examples of which are illustrated in the accompanying drawings.

Figure 4:
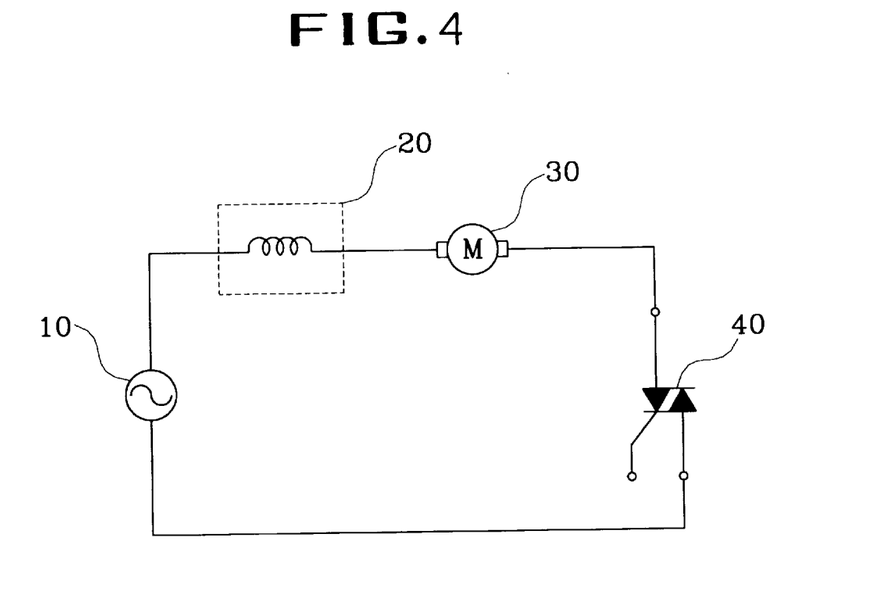
FIG. 4 is a diagram showing a motor driving circuit having a reactor for attenuating harmonic current according to a preferred embodiment of the present invention.

FIG. 4 show a motor driving circuit having a reactor for attenuating a harmonic current according to a preferred embodiment of the present invention. As compared with a general motor driving circuit, the motor driving circuit of the present invention further comprises a reactor 20 for attenuating the harmonic current.

Figure 5:
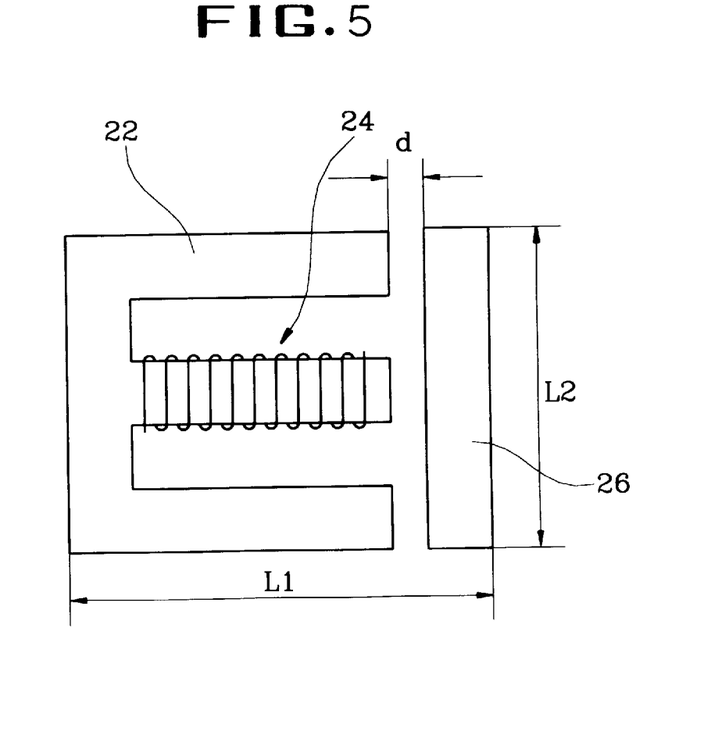
FIG. 5 is a diagram showing a configuration of the reactor shown in FIG. 4.

In FIG. 4, the reactor 20 serves to attenuate the 3rd harmonic current by phase-delaying the sine wave voltage supplied from a power supplying unit 10, and is comprised of an E shape core 22, a coil 24 wound to the E shape core 22 and an I shape core 26, as shown in FIG. 5.

The reactor 20 limits the consuming power of a motor 30 to a predetermined range of 1290 W~1422 W (preferably to 1320 W), the E shape core 22 and the I shape core 26 are set to a predetermined size of (57.5~58.5) mm×(47.5~48.5) mm (preferably to 57 mm×48 mm ) and are made of G11A, and the air gap between the E shape core 22 and I shape core 26 is set to a predetermined value of 0.9~1.1 mm (preferably to 1.0 mm).

In addition, the inductance of the coil 24 wound to the E shape core 22 is set to a predetermined value of 9.5 mH~10.5 mH (preferably to 10 mH), the diameter thereof is set to a predetermined value of 0.9φ~1.1φ (preferably to 1.0φ), the resistance R thereof is set to a predetermined value of 0.34~ 0.35Ω (preferably to 0.345Ω) and the number of winding of the coil 24 is set to a predetermined range of 140~210 turns.

In the harmonic current attenuating device having the reactor 20 configured as described above, an alternating current power is supplied from the power supplying unit 10 to the motor 30 via the reactor 20 to drive the motor 30, the internal air is compulsorily circulated by an impeller which is rotated by the engagement with the motor 30, and the contaminants like dusts are sucked in from a suction opening by the wind generated by the pressure difference between an exterior and an interior of a cleaner.

The sine wave voltage is phase-controlled by a TRIAC 40 which is switching-controlled by a gate signal, changed to a non-sinusoidal wave voltage and then supplied to the motor 30. In this case, the 3rd harmonic current is attenuated via the reactor 20 comprised of the E shape core 22, the coil 24 and the I shape core.

In detail, the rated input supplied to the motor 30 via the reactor 20 is varied and thereby the 3rd harmonic current is attenuated. The test data regarding this attenuation is explained in the following table 1.

TABLE 1

Test data of the 3rd harmonic current according to the rated input supplied to a motor

| Harmonic No. | Rated input (W) | IEC standard | Test data | Remarks |
|---|---|---|---|---|
| 3rd harmonic current | 1333W | 2.300A | 2.627A | FAIL |
|  | 1361W | 2.300A | 2.650A | FAIL |
|  | 1391W | 2.300A | 2.720A | FAIL |
|  | 1256W | 2.300A | 2.214A | PASS |
|  | 1283W | 2.300A | 2.250A | PASS |
|  | 1302W | 2.300A | 2.280A | PASS |

The reactor 20 can vary the consuming power of the motor 30 by varying the rated input supplied to the motor 30, and when the consuming power of the motor 30 is limited to a predetermined range of 1290 W~1422 W (preferably to 1320 W), the 3rd harmonic current is effectively attenuated.

In detail, when the consuming power of the motor 30 is limited to (1190 W (low limit standard)+100 W (drop rate))~(1320 W (3rd harmonic current high limit)+100 W (drop rate)+20 W (motor margin)), particularly to 1320 W, taking into account the input drop of the motor 30, it satisfies the IEC standard and can effectively attenuate the 3rd harmonic current.

In addition, if the size of the E shape core 22 and I shape core 26 constituting the reactor 20 is set to a predetermined size of (57.5~58.5) mm×(47.5~48.5) mm, preferably to 57×48, the 3rd harmonic current can be attenuated, and the test data thereon is explained by the following table 2.

TABLE 2

Test data of the 3rd harmonic current according to the size of the reactor

| Harmonic No. | Reactor size (L1 × L2) | IEC standard | Test data | Remarks |
|---|---|---|---|---|
| 3rd harmonic current | 54 mm × 45 mm | 2.300A | 2.320A | FAIL |
|  | 57 mm × 48 mm | 2.300A | 2.260A | PASS |

The size of the reactor 20 comprised of the E shape core 22 and the I shape core 26 may be varied, but when the size of the reactor 20 is set to L1×L2((57.5~58.5) mm× (47.5~48.5) mm, preferably to 57 mm×48 mm) as shown in the table 2, the 3rd harmonic current is effectively attenuated.

In addition, since the E shape core 22 and I shape core 26 constituting the reactor 20 are made of G11A, the 3rd harmonic current can be attenuated, and the test data thereon is shown in the following table 3.

TABLE 3

Test data of the 3rd harmonic current according to the material of the cores

| Harmonic No. | Material of Cores | IEC standard | Test data | Remarks |
|---|---|---|---|---|
| 3rd harmonic current | S20A | 2.300A | 2.308A~ 2.313A | FAIL |
|  | S60 | 2.300A | 2.304A | FAIL |
|  | G11A | 2.300A | 2.254A~ 2.266A | PASS |

The material of the E shape core 22 and I shape core 26 constituting the reactor 20 may be varied, but when the E shape core 22 and I shape core 26 are made of G11A, the 3rd harmonic current is effectively attenuated.

In addition, if the air gap (d) between the E shape core 22 and I shape core 26 is set to a predetermined distance of 0.9 mm~1.1 mm, preferably to 1.0 mm, the 3rd harmonic current is attenuated, and the test data thereon is shown in the following table 4.

TABLE 4

Test data of the 3rd harmonic current according to the air gap.

| Harmonic No: | Air gap (d) | IEC standard | Test data | Remarks |
|---|---|---|---|---|
| 3rd harmonic current | 0.5 mm | 2.300A | 2.352A | FAIL |
|  | 1.0 mm | 2.300A | 2.264A | PASS |
|  | 1.5 mm | 2.300A | 2.323A | FAIL |

The air gap (d) between the E shape core 22 and I shape core 26 may be varied, but when the air gap (d) is set to 0.9 mm~1.1 mm, preferably to 1.0 mm, the 3rd harmonic current is effectively attenuated.

Further, the 3rd harmonic current can be effectively attenuated by the inductance of the E shape core 22 set to a predetermined value of 9.5 mH ~10.5 mH, preferably to 10 mH.

In addition, when the diameter of the coil wound to the E shape core 22 is set to a predetermined value of 0.9φ~1.1φ, preferably to 1.0φ, the 3rd harmonic current is attenuated, and the test data thereon is explained by the following table 5.

TABLE 5

Test data of the 3rd harmonic current according to diameter of the coil

| Harmonic No. | diameter of coil | IEC standard | Test data | Remarks |
|---|---|---|---|---|
| 3rd harmonic current | 0.8φ | 2.300A | 2.320A | FAIL |
|  | 1.0φ | 2.300A | 2.260A | PASS |

The diameter of the core 24 wound to the E shape core 22 may be varied, but when the diameter of the coil 24 is set to a predetermined value of 0.9φ~1.1φ, preferably to 1.0φ as shown in the table 5, the 3rd harmonic current is effectively attenuated.

Additionally, if the resistance R of the coil 24 wound to the E shape core 22 is set to a predetermined value of 0.34Ω~0.35Ω, preferably to 0.345Ω, the 3rd harmonic current is effectively attenuated.

Furthermore, if the number of winding of the coil 24 wound to the E shape core 22 is set to a predetermined value of 140~210, the 3rd harmonic current is attenuated, and the test data thereon is shown in the following table 6.

TABLE 6

Test data of the 3rd harmonic current according to the number of winding of the coil

| Harmonic No. | Number of winding of coil | IEC standard | Test data | Remarks |
| --- | --- | --- | --- | --- |
| 3rd harmonic current | conventional | 2.300A | 2.674A | FAIL |
| | 210 | 2.300A | 1.9734A | PASS |
| | 200 | 2.300A | 1.9958A | PASS |
| | 190 | 2.300A | 2.010A | PASS |
| | 180 | 2.300A | 2.044A | PASS |
| | 170 | 2.300A | 2.085A | PASS |
| | 160 | 2.300A | 2.110A | PASS |
| | 150 | 2.300A | 2.112A | PASS |
| | 140 | 2.300A | 2.189A | PASS |

The number of winding of the coil 24 wound to the E shape core 22 may be varied, but when the number of winding of the coil 24 is set to 140~210 as shown in table 6, the 3rd harmonic current is effectively attenuated.

As described above, the 3rd harmonic current can be effectively attenuated by limiting the rated input supplied to the motor 30 via the reactor 20 to a predetermined value (preferably to 1320 W), setting the size of the E shape core 22 and I shape core 26 to a predetermined size (preferably to 57×48), using G11A as the material of the cores, setting the air gap between the E shape core 22 and I shape core 26 to a predetermined value (preferably to 1.0 mm), setting the inductance of the coil 24 wound to the E shape core 22 to a predetermined value (preferably to 10 mH), setting the diameter of the coil 24 to a predetermined value (preferably to 1.0φ), setting the resistance R of the coil 24 to a predetermined value (preferably to 0.345Ω) and setting the number of winding of the coil 24 to a predetermined range of 140~210.

Figure 6:
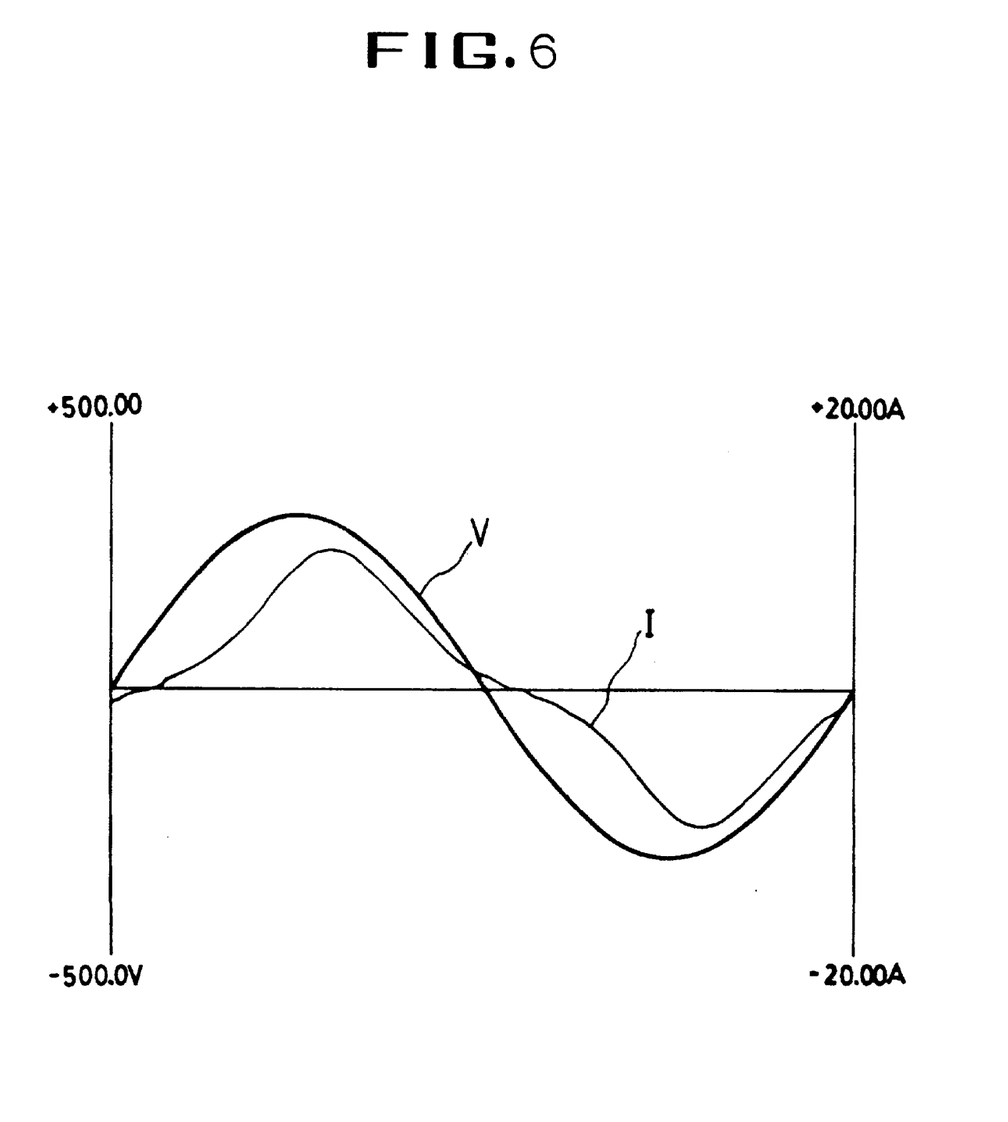
FIGS. 6 and 7 are diagrams for explaining the harmonic current generated while driving a motor having a reactor.
Figure 7:
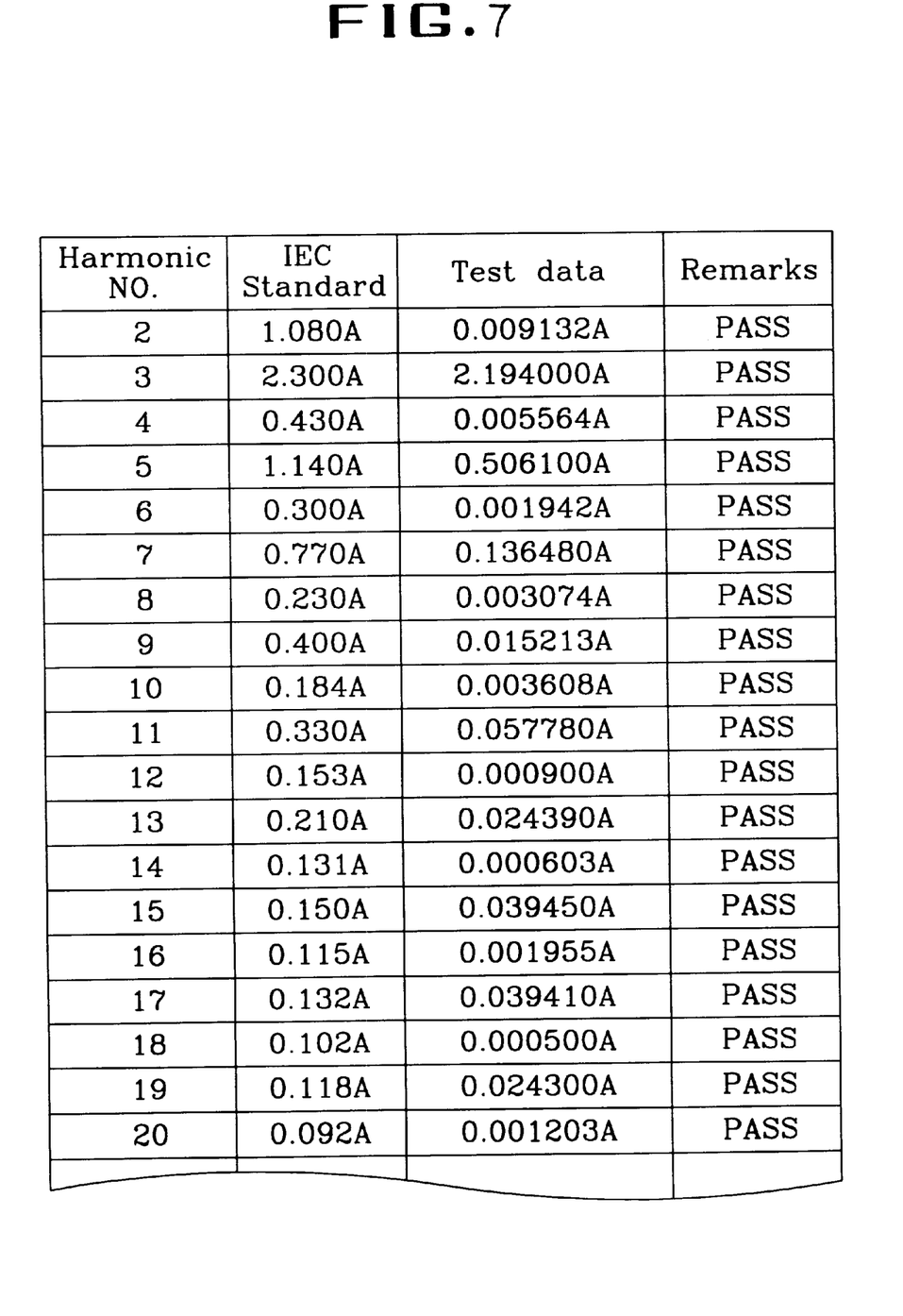

FIG. 6 shows the voltage V and current I at the motor driving circuit having the reactor 20 as described above, and FIG. 7 shows the attenuation of the 3rd harmonic current with the test data. As can be seen from FIGS. 6 and 7, the 3rd harmonic current generated when phase-controlling the sine wave voltage is effectively attenuated by the reactor 20 configured as described above.

Figure 8:
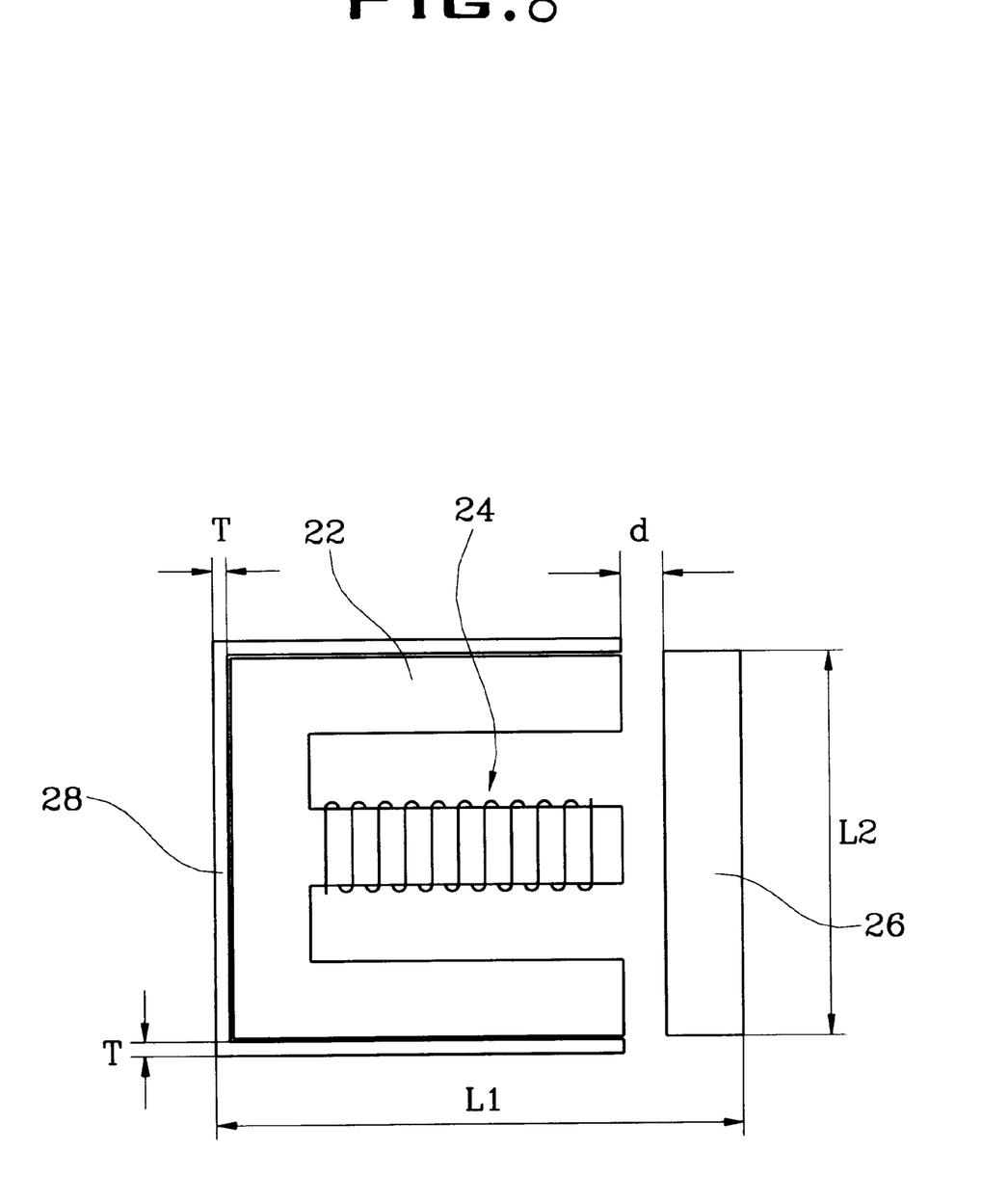
FIG. 8 is a diagram showing a [ shape clip inserted to a harmonic current attenuating device of a motor according to the present invention.

FIG. 8 shows a [ shape clip sheathing the harmonic current attenuating device of the motor according to the present invention. As compared with FIG. 5, in the harmonic current attenuating device according to another preferred embodiment of the present invention, the [ shape clip 28 sheathes the circumference of the E shape core 22. The thickness T of the [ shape clip 28 is limited to a predetermined size (preferably to 0.5 mm~2.5 mm), the material thereof is a silicon hard plate and this [ shape clip 28 is assembled to be contact to the circumference of the E shape core 22.

The operation of the harmonic current attenuating device of a motor according to another preferred embodiment of the present invention will be discussed in detail with reference to FIGS. 8 to 10.

Firstly, the alternating current power is supplied from the power supplying unit 10 to the motor 30 via the reactor 20 to drive the motor 30, the internal air is compulsorily circulated by the impeller which is rotated by the engagement with the motor 30 and contaminants like dusts are sucked in from a suction opening by the wind generated by the pressure difference between an exterior and an interior of a cleaner.

In the meanwhile, the sine wave voltage is phase-controlled by the TRIAC 40 which is switching-controlled by a gate signal, changed to a non-sinusoidal wave voltage and supplied to the motor 30. In this case, the 3rd harmonic current is attenuated via the reactor 20 comprised of the E shape core 22, the coil 24 wound to the E shape core 22 and the I shape core 26.

Figure 9:
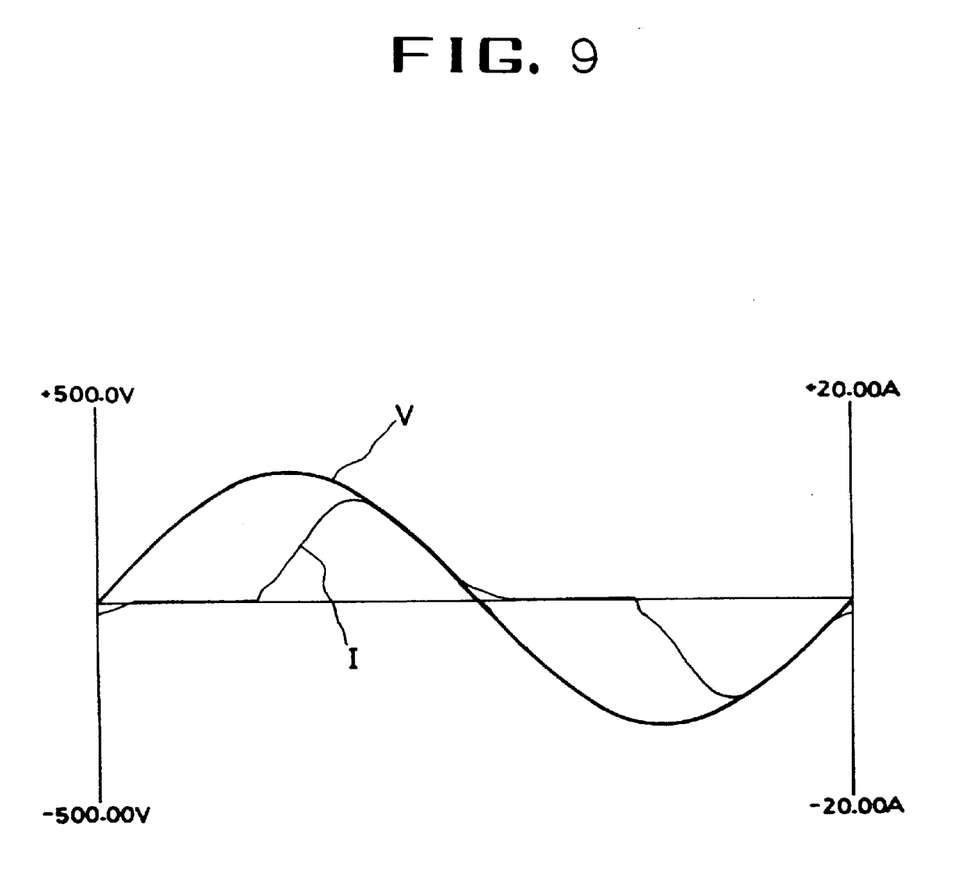
FIGS. 9 and 10 are diagrams showing the harmonic current attenuated by the harmonic current attenuating device of a motor according to the present invention.
Figure 10:
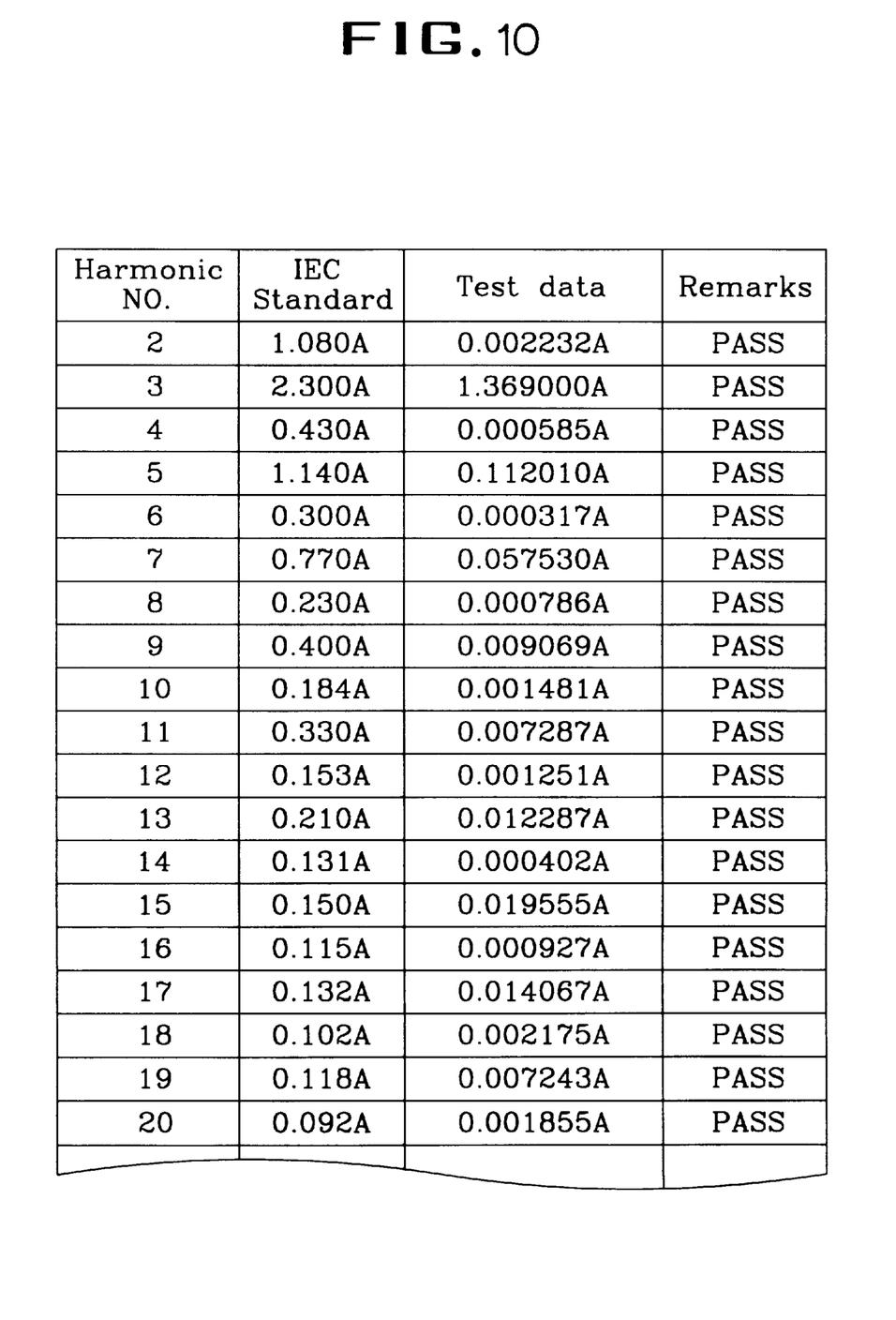

FIG. 9 shows the voltage V and current I supplied to the motor 30 at the state when the [ shape clip 28 is inserted to the circumference of the E shape core 22, and FIG. 10 shows the attenuation of the 3rd harmonic current according thereto.

As can be seen from the test data shown in FIGS. 9 and 10, the harmonic current attenuating device wherein the [ shape clip is inserted to the circumference of the E shape core 22 can attenuate the 3rd harmonic current outstandingly as compared with the harmonic current attenuating device wherein the [ shape clip is not inserted.

As described above, the present invention can effectively attenuate the 3rd harmonic current generated when phase-controlling the sine wave voltage while satisfying the IEC standard, prevent the operating disorder of the power system and enhance the selling rate of the manufactured goods.

It will be apparent to those skilled in the art that various modifications and variations can be made in a harmonic current attenuating device of a motor of the present invention without departing from the spirit or scope of the invention. Thus, it is intended that the present invention cover the modifications and variations of this invention provided they come within the scope of the appended claims and their equivalents.

What is claimed is:

1. A harmonic current attenuating device for an electric motor, comprising a reactor, wherein the reactor comprises a coil having two terminals to be connected to a power supplying circuit for the motor, an E shaped core having three parallel protruding portions from a column portion, and an I shaped core; the E shaped core and I shaped core being configured such that an air gap is formed between the three protruding portions of the E shaped core and the I shaped core; the coil being wound on a center protruding portion of the three protruding portions of E shaped core; and a clip sheathing a circumference of the E shaped core from the opposite direction of the I shaped core, wherein the clip is made of a silicon hard plate.

2. The harmonic current attenuating device as defined in claim 1, wherein the clip has a thickness of 0.5 mm~2.5 mm.

3. The harmonic current attenuating device as defined in claim 1, wherein a rated input supplied to the motor is 1290 W~1422 W.

4. The harmonic current attenuating device as defined in claim 1, wherein a total width of E shaped core and I shaped core, including the air gap is about 57.5 mm~58.5 mm, and a height of the E shaped core which is substantially the same as the height of the I shaped core is about 47.5 mm~48.5 mm.

5. The harmonic current attenuating device as defined in claim 1, wherein the E shaped core and the I shaped core are made of G11A steel.

6. The harmonic current attenuating device as defined in claim 1, wherein the air gap between the three protruding portions of the E shaped core and I shaped core is about 0.9 mm~1.1 mm.

7. The harmonic current attenuating device as defined in claim 1, wherein the coil wound on the center protruding portion of the E shaped core has inductance of about 9.5 mH~10.5 mH.

8. The harmonic current attenuating device as defined in claim 1, wherein the coil wound on the center protruding portion of the E shaped core has a diameter of about 0.9φ~1.1φ.

9. The harmonic current attenuating device as defined in claim 1, wherein the coil wound on the center protruding portion has resistance of 0.34Ω~0.35Ω.

10. The harmonic current attenuating device as defined in claim 1, wherein the number of the winding of the coil wound on the center protruding portion is 140~210 turns.

* * * * *